US012760223B2

(12) United States Patent
Hitomi et al.

(10) Patent No.: US 12,760,223 B2
(45) Date of Patent: Oct. 13, 2026

(54) SILICON ETCHING SOLUTION AND METHOD FOR PRODUCING SILICON ETCHING SOLUTION, METHOD FOR TREATING SUBSTRATE, AND METHOD FOR PRODUCING SILICON DEVICE

(71) Applicant: TOKUYAMA CORPORATION, Yamaguchi (JP)

(72) Inventors: Tatsuya Hitomi, Yamaguchi (JP); Yoshiki Seike, Yamaguchi (JP); Kohsuke Noro, Yamaguchi (JP); Kohshiro Okimura, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 332 days.

(21) Appl. No.: 18/239,303

(22) Filed: Aug. 29, 2023

(65) Prior Publication Data

US 2024/0067878 A1 Feb. 29, 2024

(30) Foreign Application Priority Data

Aug. 30, 2022 (JP) ................................ 2022-136456

(51) Int. Cl.

| | |
|---|---|
| ***C09K 13/04*** | (2006.01) |
| ***C09K 13/00*** | (2006.01) |
| ***C09K 13/02*** | (2006.01) |
| ***H10P 50/64*** | (2026.01) |
| ***H10P 50/66*** | (2026.01) |
| ***H10P 70/00*** | (2026.01) |

(52) U.S. Cl.

CPC .............. *C09K 13/04* (2013.01); *C09K 13/00* (2013.01); *C09K 13/02* (2013.01); *H10P 50/642* (2026.01); *H10P 50/644* (2026.01); *H10P 50/667* (2026.01); *H10P 70/00* (2026.01); *H10P 70/15* (2026.01); *H10P 70/20* (2026.01)

(58) Field of Classification Search

None

See application file for complete search history.

(56) References Cited

U.S. PATENT DOCUMENTS

| | | | | |
|---|---|---|---|---|
| 6,237,809 | B1 * | 5/2001 | Kawai .................. | B67D 7/0261 222/105 |
| 2009/0120458 | A1 * | 5/2009 | Hao ..................... | C11D 3/3947 134/28 |
| 2012/0267627 | A1 | 10/2012 | Barr et al. | |
| 2021/0155878 | A1 * | 5/2021 | Shimoda ............... | C07C 209/68 |
| 2021/0403323 | A1 | 12/2021 | Negishi et al. | |
| 2023/0126771 | A1 | 4/2023 | Kikkawa et al. | |

FOREIGN PATENT DOCUMENTS

| | | |
|---|---|---|
| JP | 2012-238849 A | 12/2012 |
| JP | 2013-135081 A | 7/2013 |
| WO | 2021/201094 A1 | 10/2021 |

OTHER PUBLICATIONS

Wang Juan et al., "Research Development on Wet Anisotropic Etching Mechanism of Crystal Silicon", Chemical Industry Times, vol. 18, No. 6, Jun. 2004, pp. 1-4 and 24, along with English translation thereof.

Office Action and Search Report, dated Apr. 24, 2026, that issued in corresponding Chinese application No. 202311102559.0, along with English translation thereof.

* cited by examiner

*Primary Examiner* — Jiong-Ping Lu

(74) *Attorney, Agent, or Firm* — Greenblum & Bernstein, P.L.C.

(57) ABSTRACT

A silicon etching solution including an aqueous alkaline solution containing a hypohalite ion in a range of 0.05 mmol/L or greater and 5 mmol/L or less and having a pH of 12.5 or greater at 24° C.

7 Claims, No Drawings

SILICON ETCHING SOLUTION AND METHOD FOR PRODUCING SILICON ETCHING SOLUTION, METHOD FOR TREATING SUBSTRATE, AND METHOD FOR PRODUCING SILICON DEVICE

TECHNICAL FIELD

The present invention relates to a silicon etching solution used in surface processing and/or an etching step during the production of various silicon devices, a method for producing the silicon etching solution, a method for treating a substrate, and a method for producing a silicon device.

BACKGROUND ART

Silicon (Si) is applied in various fields due to its excellent mechanical properties and electrical properties. Examples of applications utilizing the mechanical properties of silicon include: valves; nozzles; print heads; and semiconductor sensors for detecting various physical quantities such as flow rate, pressure, and acceleration (such as the diaphragm of a semiconductor pressure sensor and the cantilever of a semiconductor acceleration sensor). In addition, examples of applications utilizing the electrical properties of silicon include a part of a metal wiring, a gate electrode, and other materials in various semiconductor devices such as memory devices and logic devices.

The processing of silicon in the production of semiconductor devices is mainly performed by an etching treatment. Examples of etching methods include dry etching, such as reactive ion etching (RIE) and atomic layer etching (ALE), as well as wet etching using an aqueous acidic solution or an aqueous alkaline solution. In many case, wet etching is inferior to dry etching in terms of fineness of processing. However, wet etching is superior to dry etching in terms of productivity because a large area can be processed at the same time and a plurality of wafers can be treated at the same time. Especially, wet etching using an aqueous alkaline solution is suitably used in processes that emphasize productivity, such as those in which the undesired silicon layer is entirely removed by etching.

There are several proposals of etching solutions that have high productivity, in other words, that can remove silicon at a high rate. For example, a proposal is a chemical etching solution obtained by adding an alkaline compound, an oxidizing agent, and a hydrofluoric acid compound to water and adjusting the pH of the resulting solution to 10 or greater (see Patent Document 1). Other proposals include a chemical etching solution containing an alkaline compound, a fluoride ion source, and an oxidizing agent source and having a pH of less than 7 (see Patent Document 2), and a method for obtaining a chemical etching solution by continuously supplying an organic alkaline solution and a halogen to a static mixer and mixing them, to thereby continuously obtain a halogen oxyacid thus generated (see Patent Document 3).

PRIOR ART DOCUMENTS

Patent Documents

Patent Document 1: JP 2013-135081 A
Patent Document 2: JP 2012-238849 A
Patent Document 3: US 2021/0403323 A1

SUMMARY OF INVENTION

Technical Problem

In general, the productivity of a wet etching step is improved by increasing the etching rate. In addition, in the production of semiconductor chips and the like, when subjecting silicon to wet etching, it is not always possible to apply the same or similar etching solution depending on factors such as the structure of the semiconductor chips to be produced. Hence, there is a demand for abundant techniques to offer choices for different situations.

Therefore, an object of the present invention is to provide, with the facilitation of a new technical configuration, a novel alkaline etching solution having a high etching rate of silicon, a method for producing the etching solution, a method for treating a substrate, and a method for producing a silicon device.

Solution to Problem

The present inventors conducted diligent research to solve the above problems. The present inventors found that the etching rate of silicon is increased remarkably when an aqueous alkaline solution contains hypohalite ions in a specific concentration range, thereby completing the present invention.

That is, the gist of the present invention is as follows.

Aspect 1: A silicon etching solution including an aqueous alkaline solution containing a hypohalite ion in a range of 0.05 mmol/L or greater and 5 mmol/L or less, and having a pH of 12.5 or greater at 24° C.

Aspect 2: The silicon etching solution according to Aspect 1, containing a quaternary ammonium ion.

Aspect 3: The silicon etching solution according to Aspect 1 or 2, wherein a content of each of metals Ag, Al, Ba, Ca, Cd, Co, Cr, Cu, Fe, K, Li, Mg, Mn, Na, Ni, Pb, and Zn is 1 ppm by mass or less.

Aspect 4: The silicon etching solution according to Aspect 3, wherein the silicon etching solution is substantially free of metal.

Aspect 5: A method for producing the silicon etching solution according to any one of Aspects 1 to 4, the method including a mixing step of mixing a quaternary ammonium hydroxide, a quaternary ammonium salt of hypohalous acid, and water.

Aspect 6: A method for treating a substrate, the method including a step of bringing the silicon etching solution according to any one of Aspects 1 to 4 into contact with a substrate having a Si surface to etch the Si surface.

Aspect 7: A method for producing a silicon device, the method including the method for treating a substrate according to Aspect 6 in the steps.

Advantageous Effects of Invention

According to the present invention, hypohalite ions are contained in a specific concentration range, making it possible to perform wet etching of silicon at a high etching rate. Therefore, according to the present invention, etching can be performed at a high rate even in situations where it is difficult to apply a known high-speed technique (etching solution) due to the material or the like of a treatment target.

DESCRIPTION OF EMBODIMENTS

In the present specification, a numerical range expressed using "X or more/greater/higher and Y or less/lower" means "from a numerical value X to a numerical value Y, inclusive", and refers to a range including the numerical value X as the lower limit and the numerical value Y as the upper limit.

In addition, in the present specification, the expression "A or B" can be read as "at least one selected from the group consisting of A and B".

In addition, although a plurality of embodiments will be described in the present specification, various conditions in the embodiments can be applied to each other within an applicable range.

In addition, when a component C contained in an etching solution is described using the expression "component C contains D", it can be read as "the etching solution contains at least D as the component C".

In addition, in the present specification, "content" can be rephrased as "concentration" while "concentration" can be rephrased as "content", within an applicable range.

(Etching Solution)

A silicon etching solution according to an embodiment of the present invention (hereinafter, which can also be simply referred to as an "etching solution agent", or referred to as an "etching agent" or an "chemical etching solution") is used in etching of silicon (crystalline silicon, amorphous silicon, or the like) during the production of semiconductor chips or the like. While there are etching of silicon performed under acidic conditions and etching of silicon performed under alkaline conditions, the etching solution according to the present embodiment is an aqueous alkaline solution for etching under alkaline conditions.

In etching of silicon, a higher alkali concentration (which leads to higher alkalinity) tends to result in a higher etching rate. The etching solution according to the present embodiment has a pH (at 24° C.) of 12.5 or greater, which means high alkalinity. The pH is preferably 13.0 or greater, more preferably 13.2 or greater, even more preferably 13.3 or greater, and particularly preferably 13.4 or greater. Meanwhile, a higher alkalinity results in a more dangerous solution when there is a leakage or the like. Also, components added for making the solution alkaline tend to be highly harmful, and the cost is also relatively high. From such viewpoints, the pH can be 14.0 or less, 13.7 or less, or 13.6 or less. Since the etching solution according to the present embodiment contains hypohalite ions which will be described below, the etching rate of silicon is higher than that of a known etching solution even at the same pH. Note that this pH refers to a value measured at 24° C. by the glass electrode method.

The fact that the etching solution has such a pH means that a large amount (an amount indicating the pH above) of hydroxide ions are present in the etching solution. In addition, counter cations of hydroxide ions are naturally present. Here, as will be described later, the etching solution is preferably free of metal. From this viewpoint, the counter cations are preferably not metal cations such as $Na^+$ or $K^+$. That is, cations that can preferably be present as counter cations in the etching solution are non-metal cations such as ammonium ions.

The non-metal cations are not particularly limited, and examples thereof include unsubstituted ammonium ions, primary ammonium cations, secondary ammonium cations, tertiary ammonium cations, and quaternary ammonium cations. The counter cations are particularly preferably quaternary ammonium ions. This is because the etching solution is strongly basic, and thus there is a possibility that, when the counter cations are unsubstituted ammonium ions, primary ammonium cations, secondary ammonium cations, or tertiary ammonium cations, the counter cations may take the form of free ammonia or amine and volatilize and leave the system.

Specific examples of the quaternary ammonium ions include tetramethylammonium ions, ethyltrimethylammonium ions, tetraethylammonium ions, tetrapropylammonium ions, tetrabutylammonium ions, trimethyl-2-hydroxyethylammonium ions, dimethylbis(2-hydroxyethyl)ammonium ions, or methyltris(2-hydroxyethyl)ammonium ions, phenyltrimethylammonium ions, or benzyltrimethylammonium ions.

A smaller size of the quaternary ammonium ions tends to result in a higher etching rate. Among the examples above, quaternary ammonium ions having a total carbon number of 8 or less are preferable, and quaternary ammonium ions having a total carbon number of 6 or less (such as tetramethylammonium ions or ethyltrimethylammonium ions) are particularly preferable.

Note that, it goes without saying that such counter cations may be counter ions of hypohalite ions which will be described later, rather than only counter ions of hydroxide ions, and, when the etching solution contains other anions, such counter cation may also be counter ions of those anions.

Furthermore, one kind of such counter cations can be present, or a plurality of kinds of such counter cations can be present.

The greatest feature of the etching solution according to the present embodiment is that the etching solution contains hypohalite ions in a range of 0.05 mmol/L or greater and 5 mmol/L or less. With hypohalite ions contained in the etching solution, the etching rate of silicon, particularly the etching rate of the (100) plane and the (110) plane of silicon, is improved as compared with the case where hypohalite ions are not contained. Meanwhile, when the content of hypohalite ions is too high, the etching rate is decreased. This is inferred to be because when the amount of hypohalite ions, which serve as an oxidizing agent, is too large, the silicon surface is strongly oxidized and becomes difficult to be etched under alkaline conditions.

The content of hypohalite ions in the etching solution is preferably 0.1 mmol/L or greater, more preferably 0.2 mmol/L or greater, even more preferably 0.3 mmol/L or greater, particularly preferably 0.5 mmol/L or greater, and preferably 4.5 mmol/L or less, more preferably 4.0 mmol/L or less, even more preferably 2.5 mmol/L or less, particularly preferably 2.0 mmol/L or less. Note that, the concentration of hypohalite ions can be determined by the titration method.

Examples of the hypohalite ions include hypochlorite ions ($ClO^-$), hypobromite ions ($BrO^-$), and hypoiodite ion ($IO^-$), of which hypochlorite ions or hypobromite ions are particularly preferable from the viewpoint of stability.

When the counter ions of the hydroxide ions and the hypohalite ions present in the etching solution are quaternary ammonium ions, the content thereof is usually the content of the hypohalite ions and the content of a quaternary ammonium hydroxide used for making the etching solution alkaline. Therefore, the content of the quaternary ammonium ions is usually 40 mmol/L or greater and 1200 mmol/L or less, preferably 60 mmol/L or greater and 800 mmol/L or less, more preferably 80 mmol/L or greater and 600 mmol/L or less, and even more preferably 100 mmol/L or greater and 400 mmol/L or less.

Note that, this content range can also be regarded as the content range of cations (counter cations) in the etching solution.

In the production of semiconductor chips, when a treatment liquid such as an etching solution contains a metal, the metal often adversely affects an object to be treated (not limited to a silicon surface that is an etching target).

Therefore, the concentration of the metal in the etching solution is preferably low.

Specifically, the etching solution preferably contains 1 ppm by mass or less of, more preferably 1 ppb by mass or less of, and even more preferably substantially free of each of metals Ag, Al, Ba, Ca, Cd, Co, Cr, Cu, Fe, K, Li, Mg, Mn, Na, Ni, Pb, and Zn. Note that, in chemical solutions used in semiconductor production, the metals listed here, namely, Ag, Al, Ba, Ca, Cd, Co, Cr, Cu, Fe, K, Li, Mg, Mn, Na, Ni, Pb, and Zn, are metals considered to affect quality. Furthermore, particularly preferably, the etching solution is substantially free of not only the metal listed but any metal; further particularly preferably, the content of any metal is below the detection limit.

In the present specification, "substantially free of" means that something is not contained except for as unavoidable impurities. In other words, it means that something may be contained as unavoidable impurities.

The concentration of metal in the etching solution can be measured by, for example, ICP emission spectrometry or ICP-MS analysis.

The etching solution is usually an aqueous alkaline solution, which in this case contains water. When water is contained, etching is carried out in a preferable manner. In general, the proportion of water in the etching solution is preferably 30 mass % or more, more preferably 50 mass % or more, even more preferably 60 mass % or more, particularly preferably 75 mass % or more, and can be 80 mass % or more, 90 mass % or more, or 95 mass % or more, although the proportion varies depending on the types and amounts of other components. The upper limit of the proportion is not particularly limited as long as the other components can be contained in a necessary amount, but is usually 99.5 mass % or less, with 99 mass % or less being a sufficient limit.

The silicon etching solution can further contain a known component contained in a silicon etching solution, particularly a silicon etching solution including an aqueous alkaline solution. In this case, even if the component lowers the etching rate of silicon, when such a component needs to be added for a certain purpose, the etching rate can be improved by the addition of hypohalite ions as described above. Therefore, the effect of a decrease in etching rate due to the addition of the other component can be mitigated. However, hypohalite ions have a high oxidizing power, and thus the silicon etching solution preferably does not contain easily oxidizable components from the viewpoint of storage stability.

Meanwhile, when etching silicon during the production of semiconductor chips, it is often desirable not to etch a silicon dioxide portion (surface) and/or a silicon nitride portion (surface). Therefore, the etching solution preferably does not contain a component that promotes etching of silicon dioxide ($SiO_2$) and/or silicon nitride (SiN) under alkaline conditions. A typical example of such a component is fluoride ions. Note that the etching solution can contain another halogen ion such as a chloride ion or a bromide ion.

The etching solution is preferably a homogeneous solution in which all of the components added are dissolved. Further, from the viewpoint of preventing contamination during etching, the number of particles with a size of 200 nm or greater is preferably 100/mL or less, more preferably 50/mL or less, and particularly preferably 10/mL or less.

(Production Method)

The method for producing the etching solution described above is not particularly limited, and examples thereof include a method including a mixing step of mixing various alkaline compounds serving as a component that makes the etching solution alkaline, a hypohalite serving as a supply source of hypohalite ions, and water serving as an optional component, particularly a step of mixing these components to give predetermined contents. In the mixing step, the alkaline compound and the hypohalite are preferably homogeneously dissolved in water. Note that, this method can include a step in addition to the mixing step described above.

In the mixing step, a method for mixing the components is not particularly limited, and a known method can be used to mix the components. The mixing conditions are also not particularly limited. Any conditions such as temperature or pressure can be adopted, or the mixing can be performed at normal temperature and/or normal pressure.

As described above, the etching solution preferably does not contain metal, and thus the alkaline compound is preferably not a metal hydroxide such as NaOH or KOH.

Therefore, the alkaline compound contained in the etching solution for making the etching solution alkaline is preferably ammonia, a primary amine, a secondary amine, a tertiary amine, or a quaternary ammonium hydroxide. From the perspective of achieving a pH of 12.5 or greater, particularly 13.0 or greater, a quaternary ammonium hydroxide is preferable.

Specific examples of the quaternary ammonium hydroxide include tetramethylammonium hydroxide (TMAH), ethyltrimethylammonium hydroxide (ETMAH), tetraethylammonium hydroxide, tetrapropylammonium hydroxide, tetrabutylammonium hydroxide, trimethyl-2-hydroxyethylammonium hydroxide (choline hydroxide), dimethylbis(2-hydroxyethyl)ammonium hydroxide, or methyltris(2-hydroxyethyl)ammonium hydroxide, phenyltrimethylammonium hydroxide, or benzyltrimethylammonium hydroxide.

Note that, these quaternary ammonium hydroxides are usually entirely dissociated in the etching solution and present as hydroxide ions and quaternary ammonium ions which are counter cations.

The quaternary ammonium hydroxide used is preferably a product having as few metal impurities and/or insoluble impurities as possible as described above, or can be a commercially available product purified as necessary by recrystallization, column purification, ion exchange purification, filtration treatment, or the like. When the alkaline compound is a quaternary ammonium hydroxide, depending on the type, the quaternary ammonium hydroxide is preferably an extremely pure quaternary ammonium hydroxide produced or sold for semiconductor production purposes. Note that high-purity quaternary ammonium hydroxides for semiconductor production purposes are typically sold as solutions such as aqueous solutions. During the production of the silicon etching solution, a high-purity quaternary ammonium hydroxide solution may be mixed as-is with water and/or other components added.

Note that, the amount of the quaternary ammonium hydroxide required to adjust the pH of the etching solution to 12.5 or greater is usually 35 mmol/L or greater, although it depends on the types and amounts of other components added. A larger amount of the quaternary ammonium hydroxide results in a higher alkalinity. The amount of the quaternary ammonium hydroxide is preferably 50 mmol/L or greater, more preferably 100 mmol/L or greater, and particularly preferably 150 mmol/L or greater. In addition, the amount of the quaternary ammonium hydroxide can be 1200 mmol/L or less, or can be 1000 mmol/L or less, and sufficient performance can be achieved even when the amount is 800 mmol/L or less.

An ammonium salt of hypohalous acid to be used is preferably a non-metal salt. Specifically, various ammonium salts are more preferable, and a quaternary ammonium salt is particularly preferable. Specific examples thereof include a tetramethylammonium salt, an ethyltrimethylammonium salt, a tetraethylammonium salt, a tetrapropylammonium salt, a tetrabutylammonium salt, a phenyltrimethylammonium salt, a benzyltrimethylammonium salt, or the like of hypochlorous acid or hypobromous acid.

The ratio of the ammonium salt of hypohalous acid added actually determines the concentration of hypohalite ions contained in the etching solution. Therefore, the amount of the ammonium salt of hypohalous acid added is preferably 0.05 or greater and 5 mmol or less per 1 L of the etching solution to be prepared. The amount of the ammonium salt of hypohalous acid added is more preferably 0.1 mmol/L or greater, particularly preferably 0.2 mmol/L or greater, and preferably 2.5 mmol/L or less, particularly preferably 2.0 mmol/L or less.

When water is used, the water also preferably has a high purity with few impurities. The amount of impurities can be evaluated by electrical resistivity. Specifically, the water preferably has an electrical resistivity of 0.1 MΩ·cm or greater, more preferably 15 MΩ·cm or greater, and particularly preferably 18 MΩ·cm or greater, with no special number designated for the upper limit. Such water with few impurities can be easily produced or purchased as ultrapure water for semiconductor production purposes. Furthermore, ultrapure water is highly suitable because it contains remarkably little impurities that do not affect (or contribute little to) the electrical resistivity.

Note that, examples of the hypohalite include a quaternary ammonium salt of hypohalous acid, which can be obtained by, for example, adding a halogen to an aqueous basic solution such as that of the quaternary ammonium hydroxide. That is, adding chlorine ($Cl_2$) to an aqueous solution of the quaternary ammonium hydroxide can produce an aqueous solution of a quaternary ammonium salt of hypochlorous acid, and adding bromine ($Br_2$) to an aqueous solution of the quaternary ammonium hydroxide can produce an aqueous solution of a quaternary ammonium salt of hypobromous acid.

Accordingly, the aqueous alkaline solution that contains hypohalite ions and that has a reduced metal concentration can be produced from the high-purity aqueous solution of the quaternary ammonium hydroxide and the high-purity halogen. This method can also directly produce an etching solution having a concentration within a predetermined range by adjusting the amount of production raw materials used. Alternatively, the etching solution can also be produced by adding the quaternary ammonium hydroxide and/or water to the aqueous solution of the ammonium salt of hypohalous acid produced as described above to adjust the concentration.

As described above, various compounds known as components of chemical solutions used in semiconductor production can be added as necessary; however, since hypohalite ions have a high oxidizing power, it is preferable to avoid the addition of easily oxidizable components from the viewpoint of storage stability.

Furthermore, the etching solution can contain a halogen salt of a quaternary ammonium, such as tetramethylammonium chloride, ethyltrimethylammonium iodide, dodecyltrimethylammonium bromide, or decyltrimethylammonium bromide. Note that, when such a component is added, the content of quaternary ammonium ions is further increased by an amount derived from such a component.

Note that, as described above, the etching solution is preferably free of fluoride ions. Therefore, fluorides such as ammonium fluoride or tetramethylammonium fluoride are preferably not added even though they are compounds known as components of chemical solutions used in semiconductor production. Similarly, $PF_6$ salts, $BF_4$ salts, and the like are also preferably not added.

In the production of the etching solution, after mixing and dissolving the components, the resulting solution is preferably passed through a filter with openings of several nanometers or greater and several tens of nanometers or less to remove particles. The process of passing the resulting solution through a filter can be performed multiple times as necessary.

In addition, other various known treatments for obtaining the necessary physical properties during the production of chemical solutions used in semiconductor production can be applied. Examples of such treatment include reducing dissolved oxygen by bubbling with an inert gas such as high-purity nitrogen gas.

During mixing and dissolution (and storage), the container and device to be used are preferably formed of and/or coated with a material from which contaminants are less likely to be dissolved in the etching solution. Examples of such material include known materials for the inner wall of containers and device containing chemical solutions used in semiconductor production, with specific examples being polyfluoroethylene and high-purity polypropylene. The container and device are preferably cleaned in advance.

(Application and Method of Use)

The silicon etching solution described above can be used in the etching treatment of substrates in each step when producing various silicon composite semiconductor devices (silicon devices), including silicon wafers, silicon single crystal films, polysilicon films, or amorphous silicon films. The silicon single crystal film includes one made by epitaxial growth.

That is, by bringing the silicon etching solution described above into contact with a substrate having a silicon (Si) surface, the Si surface can be subjected to an etching treatment. A method for treating a substrate according to another embodiment of the present invention includes a step of bringing the silicon etching solution described above into contact with a substrate having a Si surface to etch the Si surface. Note that, the method for treating a substrate can include a step in addition to the step described above. Furthermore, a method for producing a silicon device according to still another embodiment of the present invention includes the method for treating a substrate in the steps. Note that, the method for producing a silicon device can include a step in addition to the step described above.

Meanwhile, the etching solution usually does not etch silicon dioxide ($SiO_2$) or silicon nitride (SiN), although it depends on the components that are optionally added. Therefore, examples of a target to be treated with the etching solution include a substrate having a silicon nitride surface and/or a silicon dioxide surface and a silicon (including silicon single crystal, polysilicon, and amorphous silicon) surface on the surface to be treated. The target to be treated can include various metal films and the like. Examples of the target to be treated include an object in which silicon and silicon dioxide are alternately stacked, and a structure in which a pattern is formed on a silicon single crystal using polysilicon, silicon nitride, or silicon dioxide.

A method for processing a substrate using the silicon etching solution includes, for examples, a method that includes a substrate holding step of holding a substrate in a horizontal posture, and a treatment liquid supplying step of supplying the etching solution onto a principal surface of the substrate while rotating the substrate about a vertical rotation axis passing through the central portion of the substrate.

Another method for processing a substrate using the silicon etching solution includes, for example, a method that includes a substrate holding step of holding a plurality of substrates in an upright posture, and a step of immersing the substrates in the upright posture in the etching solution according to an embodiment of the present invention stored in a treatment tank.

In a preferred embodiment, the silicon etching solution is used in the production of silicon devices that includes a step of selectively etching a silicon film by supplying the etching solution during the etching of silicon wafers, especially various silicon composite semiconductor devices containing silicon nitride and/or silicon dioxide.

The temperature of the silicon etching solution during etching using the silicon etching solution may be appropriately determined within a range of 20° C. or higher and 95° C. or lower, preferably in a range of 35° C. or higher and 90° C. or lower, taking into consideration the desired etching rate, the shape and/or surface condition of silicon after etching, productivity, and the like. Further, the etching time is not particularly limited and can be appropriately set in accordance with the amount of the etching solution, the size of the etching target, and the like. From the viewpoints of controlling the etching amount and productivity, the etching time is preferably 10 seconds or more and 120 minutes or less, more preferably 20 seconds or more and 90 minutes or less, and particularly preferably 30 seconds or more and 60 minutes or less.

Etching using the silicon etching solution can be carried out simultaneously with degassing in vacuum, degassing under reduced pressure, or bubbling with an inert gas. Such an operation can suppress an increase of dissolved oxygen or reduce the dissolved oxygen during etching.

During etching using the silicon etching solution, the object to be etched can be brought in contact with the etching solution simply by being immersed in the etching solution, or via an electrochemical etching method in which a constant potential is applied to the object to be etched.

In a semiconductor production flow with a gate-last process, for example, the etching solution can selectively remove only silicon from a device structure in which a polysilicon dummy gate is surrounded by silicon nitride and silicon dioxide serving as insulating films. Therefore, the etching solution can contribute to the formation of a gate structure. Therefore, as described above, the silicon etching solution described above can be suitably used as an etching solution in the production of semiconductor devices (silicon devices) such as silicon devices that includes a step of etching a silicon wafer, a silicon single crystal film, a polysilicon film, or an amorphous silicon film.

EXAMPLES

Hereinafter, the present invention will be described in further detail by examples, but the present invention is not limited to these examples.

Experimental methods and evaluation methods in Examples and Comparative Examples are as follows.

Abbreviations

Abbreviations for the compounds used are as follows.

TMAH: tetramethylammonium hydroxide

TMAClO: tetramethylammonium salt of hypochlorous acid

TMABrO: tetramethylammonium salt of hypobromous acid $H_2O_2$: hydrogen peroxide $TMAClO_4$: tetramethylammonium salt of perchloric acid $NH_4NO_3$: ammonium nitrate (Preparation Method of Etching Solution)

TMAH aqueous solutions (2730 mmol/L) were diluted with ultrapure water and mixed until the chemical solutions were homogeneous. Then, various oxidizing agents were added to prepare etching solutions of Examples and Comparative Examples having the compositions presented in Table 1. Note that, the forms of the oxidizing agents used in the preparation are as follows.

<Forms of Oxidizing Agents Used in Preparation>

TMAClO aqueous solution: 230 mmol/L aqueous solution

TMABrO aqueous solution: 95 mmol/L aqueous solution $H_2O_2$ aqueous solution: 10300 mmol/L aqueous solution $TMAClO_4$: single-ingredient powder $NH_4NO_3$: single-ingredient powder Note that, tetramethylammonium hydroxide serving as the alkaline compound was added to adjust its concentration in the etching solution to 260 mmol/L (2.38 mass %) in all Examples and Comparative Examples, except for in Comparative Example 4. In Comparative Example 4, tetramethylammonium hydroxide serving as the alkaline compound was added to adjust its concentration in the etching solution to 11 mmol/L (0.1 mass %).

(Measurement Method of pH of Chemical Etching Solution)

The measurement was carried out under a temperature condition of 24° C. using a desktop pH meter F-73 available from Horiba, Ltd., and a flat pH electrode, ISFET pH electrode 0040-10D, available from Horiba, Ltd.

(Evaluation Method of Etching Rate (Unit: nm/min))

First, the following three types of Si substrates were prepared for determination of the etching rate for each crystal plane of Si (100) plane, Si (110) plane, and Si (111) plane.

Substrate A: a 2 cm square single crystal silicon substrate whose front and back surfaces are mirror surfaces of Si (100) plane (available from SUMTEC Service Corp.);

Substrate B: a 2 cm square single crystal silicon substrate whose front and back surfaces are mirror surfaces of Si (110) plane (available from SUMTEC Service Corp.);

Substrate C: a 2 cm square single crystal silicon substrate whose front and back surfaces are mirror surfaces of Si (111) plane (available from ENATECH Corp.)

Before etching treatment, each Si substrate was weighted in the unit of g to 5 decimal places using an electronic balance AUW220D available from Shimadzu Corporation.

Each Si substrate was subjected to an etching treatment by being immersed for 10 minutes in 100 ml of each of the etching solutions heated to 70° C. Thereafter, each Si substrate was washed with ultrapure water and then dried.

The weight of each substrate after the etching treatment was measured in the same manner as before the etching treatment. The etching rate per one side of a substrate was calculated in accordance with Equation (1) below using the change in weight before and after etching and a value of the density of regular single crystal silicon which is 2.329 g/$cm^3$. Note that, in Equation (1) below, the unit of "etching rate" is "nm/min", the unit of "surface area of the front and back surfaces of the substrate" is "$cm^2$", the unit of "2.329", which is a value indicating the density of single crystal silicon, is "g/$cm^3$", the unit of "change in weight before and after etching" is "g", and the unit of "etching time" is "min".

Etching Rate=Surface Area of the Front and Back Surfaces of the Substrate$\times 10^7$/2.329/Change in Weight Before and After Etching/Etching Time (1)

(Evaluations)

The following evaluation was given based on how many times the etching rate of silicon was increased as compared with Reference Example (aqueous solution of TMAH).

S: 1.50 times or greater

A: 1.30 times or greater and less than 1.50 times

B: 0.80 times or greater and less than 1.30 times

C: less than 0.80 times

In the overall evaluation, the evaluation "Extraordinary" was given in a case where both of the (100) plane and the (110) plane were "S", the evaluation "Excellent" was given in a case where either of the (100) plane and the (110) plane was "S", the evaluation "Good" was given in a case where either of the (100) plane and the (110) plane was "A", the evaluation "Average" was given in a case where both of the (100) plane and the (110) plane were "B" (no effect in particular), and the evaluation "Unacceptable" was given in other cases.

Note that, for reference, the etching rate multipliers of the (111) plane were also given the evaluations of S to C in the same manner as described above.

REFERENCE EXAMPLE 260 mmol/L of aqueous solution of TMAH was used to evaluate the etching rate of silicon. The results are depicted in Table 1.

Example 1

The etching rate of silicon was evaluated using an aqueous solution having a concentration of TMAH of 260 mmol/L and a concentration of hypochlorite ions of 0.8 mmol/L. The results are depicted in Table 1. In this experimental example, both the (100) plane and the (110) plane were "S", and the overall evaluation was "Extraordinary". Note that, in this composition, the etching rate of the (111) plane was also improved by about 1.3 times (corresponding to A), which was overall outstanding.

Example 2, Comparative Examples 1 to 3

Etching solutions with the concentration of hypochlorite ions changed as presented in Table 1 were prepared and evaluated. The results are all presented Table 1.

In this concentration range, it can be seen that a higher concentration of hypochlorite ions tended to result in a lower etching rate. In Comparative Example 1 in which the concentration was 8 mmol/L, there was no large difference from the case in which no hypochlorite ions were added; in Comparative Examples 2 and 3 in which the concentrations further increased, the etching rates deteriorated instead.

Comparative Example 4

Etching solutions with a concentration of TMAH of 8.7 mmol/L and the concentration of hypochlorite ions changed as presented in Table 1 were prepared and evaluated. The results are all presented Table 1.

Examples 3 and 4, Comparative Examples 5 and 6

Etching solutions containing hypobromite ions instead of hypochlorite ions were prepared and evaluated. The concentrations and evaluation results are presented in Table 1. Also in this example, the solutions having a low concentration of hypobromite ions exhibited outstanding performance, while there was a tendency that a higher concentration of hypobromite ions resulted in a lower etching rate.

Comparative Examples 7 and 8

Etching solutions containing hydrogen peroxide instead of hypochlorite ions were prepared and evaluated. The concentrations and evaluation results are presented in Table 1.

Comparative Examples 9 and 10

Etching solutions containing perchlorate ions instead of hypochlorite ions were prepared and evaluated. The concentrations and evaluation results are presented in Table 1.

Comparative Examples 11 to 13

Etching solutions containing nitrate ions instead of hypochlorite ions were prepared and evaluated. The concentrations and evaluation results are presented in Table 1.

Note that, the metal concentrations of any metal in the etching solutions were 1 mass ppb % or less in all Examples and Comparative Examples.

TABLE 1

| | Compound Added | | | | | | | | Evaluation | | | |
|---|---|---|---|---|---|---|---|---|---|---|---|---|
| | Type | Mass Concentration (mass %) | Molar Concentration (mmol/L) | Water Content (mass %) | pH of Etching Solution | ER (nm/min) at 70° C. 100 Plane | 110 Plane | 111 Plane | 100 Plane | 110 Plane | 111 Plane (Reference) | Overall Evaluation |
| Reference Example | Not Added | N.A. | | 97.6 | 13.4 | 335 | 370 | 86 | B | B | B | Average |
| Example 1 | TMAClO | 0.01 | 0.8 | 97.6 | 13.5 | 629 | 786 | 113 | S | S | A | Extraordinary |
| Example 2 | | 0.05 | 4.0 | 97.6 | 13.5 | 352 | 567 | 80 | B | S | B | Excellent |
| Comparative Example 1 | | 0.10 | 8.0 | 97.5 | 13.5 | 298 | 447 | 85 | B | B | B | Average |
| Comparative Example 2 | | 0.15 | 11.9 | 97.5 | 13.5 | 214 | 265 | 63 | C | C | C | Unacceptable |
| Comparative Example 3 | | 0.92 | 73.3 | 96.7 | 13.6 | 33 | 37 | 11 | C | C | C | Unacceptable |
| Comparative Example 4 | | 0.92 | 73.3 | 99.0 | 11.7 | 3 | 3 | 3 | C | C | C | Unacceptable |

TABLE 1-continued

| | Compound Added | | | | | Evaluation | | | | | | |
|---|---|---|---|---|---|---|---|---|---|---|---|---|
| | | Mass Concen-tration (mass %) | Molar Concen-tration (mmol/L) | Water Content (mass %) | pH of Etching Solution | ER (nm/min) at 70° C. 100 Plane | 110 Plane | 111 Plane | 100 Plane | 110 Plane | 111 Plane (Refer-ence) | Overall Evaluation |
| | Type | | | | | | | | | | | |
| Example 3 | TMABrO | 0.01 | 0.6 | 97.6 | 13.5 | 567 | 674 | 90 | S | S | B | Extraordinary |
| Example 4 | | 0.05 | 2.9 | 97.6 | 13.5 | 350 | 654 | 41 | B | S | C | Excellent |
| Comparative Example 5 | | 0.10 | 5.9 | 97.5 | 13.6 | 64 | 54 | 9 | C | C | C | Unacceptable |
| Comparative Example 6 | | 0.15 | 8.8 | 97.5 | 13.5 | 44 | 33 | 8 | C | C | C | Unacceptable |
| Comparative Example 7 | $H_2O_2$ | 0.01 | 2.9 | 97.6 | 13.4 | 303 | 466 | 95 | B | B | B | Average |
| Comparative Example 8 | | 0.10 | 29 | 97.5 | 13.3 | 94 | 215 | 44 | C | C | C | Unacceptable |
| Comparative Example 9 | $TMAClO_4$ | 0.01 | 0.6 | 97.6 | 13.5 | 326 | 400 | 87 | B | B | B | Average |
| Comparative Example 10 | | 0.10 | 5.8 | 97.6 | 13.5 | 360 | 355 | 91 | B | B | B | Average |
| Comparative Example 11 | $NH_4NO_3$ | 0.01 | 1.2 | 97.6 | 13.5 | 336 | 378 | 81 | B | B | B | Average |
| Comparative Example 12 | | 0.10 | 12 | 97.6 | 13.5 | 321 | 358 | 73 | B | B | B | Average |
| Comparative Example 13 | | 0.59 | 74 | 97.0 | 13.3 | 361 | 392 | 73 | B | B | B | Average |

The invention claimed is:

1. A silicon etching solution consisting essentially of one or more alkaline compounds, a hypohalite serving as a supply source of hypohalite ions, and water, wherein the silicon etching solution is an aqueous alkaline solution with a hypohalite ion concentration in a range of 0.05 mmol/L or greater and 5 mmol/L or less, and a pH of 12.5 or greater at 24° C.

2. The silicon etching solution according to claim 1, wherein a content of each of metals Ag, Al, Ba, Ca, Cd, Co, Cr, Cu, Fe, K, Li, Mg, Mn, Na, Ni, Pb, and Zn is 1 ppm by mass or less.

3. The silicon etching solution according to claim 2, wherein the silicon etching solution is substantially free of metal.

4. A silicon etching solution consisting essentially of one or more alkaline compounds, a hypohalite serving as a supply source of hypohalite ions, a quaternary ammonium ion, and water, wherein the silicon etching solution is an aqueous alkaline solution with a hypohalite ion concentration in a range of 0.05 mmol/L or greater and 5 mmol/L or less, and a pH of 12.5 or greater at 24° C.

5. A method for producing the silicon etching solution according to claim 1, the method comprising a mixing step of mixing a quaternary ammonium hydroxide, a quaternary ammonium salt of hypohalous acid, and water.

6. A method for treating a substrate, the method comprising a step of bringing the silicon etching solution according to claim 1 into contact with a substrate having a Si surface to etch the Si surface.

7. A method for producing a silicon device, the method comprising treating a substrate by the method according to claim 6.

* * * * *